United States Patent
Na

(10) Patent No.: US 9,082,506 B2
(45) Date of Patent: Jul. 14, 2015

(54) SYNCHRONOUS SEMICONDUCTOR MEMORY DEVICE HAVING DELAY LOCKED LOOP CIRCUIT AND METHOD OF CONTROLLING THE DELAY LOCKED LOOP CIRCUIT

(71) Applicant: Samsung Electronics Co., Ltd., Suwon-si (KR)

(72) Inventor: Tae-Sik Na, Seoul (KR)

(73) Assignee: SAMSUNG ELECTRONICS CO., LTD., Samsung-ro, Yeongtong-gu, Suwon si, Gyeonggi-do (KR)

( * ) Notice: Subject to any disclaimer, the term of this patent is extended or adjusted under 35 U.S.C. 154(b) by 0 days.

(21) Appl. No.: 14/204,444

(22) Filed: Mar. 11, 2014

(65) Prior Publication Data
US 2014/0269119 A1    Sep. 18, 2014

(30) Foreign Application Priority Data
Mar. 13, 2013 (KR) .................. 10-2013-0026876

(51) Int. Cl.
| G11C 7/00 | (2006.01) |
| G11C 5/14 | (2006.01) |
| G11C 8/00 | (2006.01) |
| G11C 8/16 | (2006.01) |
| G11C 11/4076 | (2006.01) |
| G11C 5/04 | (2006.01) |
| G11C 7/22 | (2006.01) |
| G11C 11/4074 | (2006.01) |
| G11C 8/18 | (2006.01) |

(52) U.S. Cl.
CPC .............. *G11C 11/4076* (2013.01); *G11C 5/04* (2013.01); *G11C 7/222* (2013.01); *G11C 8/18* (2013.01); *G11C 11/4074* (2013.01); *G11C 2207/2227* (2013.01); *G11C 2207/2272* (2013.01)

(58) Field of Classification Search
USPC .......... 365/193, 194, 226, 227, 233.1, 233.13
See application file for complete search history.

(56) References Cited

U.S. PATENT DOCUMENTS

| 5,337,285 | A | 8/1994 | Ware et al. |
| 6,043,694 | A | 3/2000 | Dortu |
| 6,407,962 | B1 | 6/2002 | Ka |
| 6,822,924 | B2 | 11/2004 | Lee |
| 6,977,848 | B2 | 12/2005 | Choi |
| 6,982,924 | B2 * | 1/2006 | Na ................ 365/194 |
| 7,024,571 | B1 | 4/2006 | Reger et al. |
| 7,100,065 | B2 | 8/2006 | Adkisson |
| 7,263,148 | B2 | 8/2007 | Chang et al. |
| 7,340,632 | B2 | 3/2008 | Park |
| 7,342,412 | B2 | 3/2008 | Kim |
| 7,418,071 | B2 | 8/2008 | Harrison |
| 7,450,440 | B2 | 11/2008 | Kim et al. |

(Continued)

FOREIGN PATENT DOCUMENTS

| KR | 10-2000-0006413 A | 1/2000 |
| KR | 10-2011-0052941 A | 5/2011 |

*Primary Examiner* — Trong Phan
(74) *Attorney, Agent, or Firm* — Muir Patent Law, PLLC

(57) ABSTRACT

An operating method of a delay locked loop (DLL) circuit for a semiconductor memory device is disclosed. The DLL circuit may include a plurality of sub-circuits. The method may include calculating an additive latency value based on predetermined parameters, and controlling a set of the plurality of sub-circuits of the DLL circuit to be maintained in a turn-off state based on the calculated additive latency value, during a period of time after the semiconductor device receives an operation command in a power saving mode.

20 Claims, 9 Drawing Sheets

(56) References Cited

U.S. PATENT DOCUMENTS

| | | |
|---|---|---|
| 7,457,191 B2 | 11/2008 | Lee |
| 7,489,172 B2 | 2/2009 | Kim |
| 7,549,092 B2 | 6/2009 | Jang |
| 7,590,013 B2 * | 9/2009 | Yu et al. .................. 365/233.1 |
| 7,593,285 B2 | 9/2009 | Cho |
| 7,764,106 B2 | 7/2010 | Do |
| 7,830,731 B2 | 11/2010 | Kim et al. |
| 7,912,111 B2 | 3/2011 | Cartmell |
| 7,916,562 B2 * | 3/2011 | Ku ............................ 365/194 |
| 7,940,109 B2 | 5/2011 | Do |
| 8,144,531 B2 * | 3/2012 | Choi et al. ................. 365/194 |
| 8,233,339 B2 * | 7/2012 | Yoon et al. ................ 365/194 |
| 8,358,546 B2 * | 1/2013 | Kim et al. .................. 365/194 |
| 8,369,122 B2 * | 2/2013 | Byeon et al. .............. 365/194 |
| 8,379,459 B2 * | 2/2013 | Gower et al. .............. 365/193 |
| 8,436,641 B2 * | 5/2013 | Song ......................... 365/193 |
| 8,917,563 B2 * | 12/2014 | Miyano et al. ............ 365/194 |
| 2009/0259743 A1 | 10/2009 | Isrel, Jr. et al. |
| 2009/0267837 A1 | 10/2009 | Lin |
| 2011/0116330 A1 | 5/2011 | Kim et al. |
| 2011/0276817 A1 | 11/2011 | Fullerton et al. |

* cited by examiner

Fig. 4

| N/CL | 5 | 6 | 7 | 8 | 9 | 10 | 11 |
|---|---|---|---|---|---|---|---|
| 1 | 2 | 3 | 4 | 5 | 6 | VDD↑7 | 8 |
| 2 | 1 | 2 | 3 | 4 | 5 | 6 | 7 |
| 3 | 0 | 1 | 2 | 3 | 4 | 5 | 6 |
| 4 | X | 0 | 1 | 2 | 3 | 4 | 5 |
| 5 | X | X | 0 | 1 | 2 | 3 | 4 |
| 6 | X | X | X | 0 | 1 | 2 | 3 |
| 7 | X | X | X | X | 0 | 1 | 2 |
| 8 | X | X | X | X | X | 0 | 1 |
| 9 | X | X | X | X | X | X | 0 |
| 10 | X | X | X | X | X | X | X |

VDD 1.35V
VDD 1.10V

SYNCHRONOUS SEMICONDUCTOR MEMORY DEVICE HAVING DELAY LOCKED LOOP CIRCUIT AND METHOD OF CONTROLLING THE DELAY LOCKED LOOP CIRCUIT

CROSS-REFERENCE TO RELATED APPLICATIONS

This application claims priority under 35 U.S.C. §119 to Korean Patent Application No. 10-2013-0026876, filed on Mar. 13, 2013, the entire contents of which are hereby incorporated by reference.

BACKGROUND OF THE INVENTION

The present disclosure herein relates to semiconductor memory devices, and more particularly, to a synchronous semiconductor memory device having a delay locked loop and a method of controlling a delay locked loop block to save power.

Generally, a synchronous semiconductor memory device performs an operation of outputting data in synchronization with a clock being applied from the outside.

When a clock being applied from the outside is used inside the device, a time delay (a clock skew) caused by internal circuits inevitably occurs. A delay locked loop (DLL) circuit controls the time delay so that an internal clock may have the same phase as an external clock.

Since the application of a read latency operation and an on die termination (ODT) technology to a double data rate synchronous dynamic random access memory (DDR SDRAM) may require a synchronous operation of a clock, a DLL circuit may be mostly built in an SDRAM.

As an operation speed in a synchronous semiconductor memory device becomes high, an operation characteristic of a DLL circuit becomes more important. A measure for effectively reducing power being consumed in a DLL circuit may be needed to implement a low power operation.

SUMMARY

Embodiments of the disclosure provide a semiconductor memory device including a delay locked loop (DLL) circuit and a method of controlling the DLL circuit.

In one embodiment, an activation method of a delay locked loop (DLL) circuit for a semiconductor device is disclosed. The DLL circuit may include a plurality of sub-circuits. The method may include calculating an additive latency value based on predetermined parameters, and controlling a set of the plurality of sub-circuits of the DLL circuit to be maintained in a turn-off state based on the calculated additive latency value, during a period of time after the semiconductor memory device receives an operation command in a power saving mode.

In another embodiment, a semiconductor memory device is disclosed. The semiconductor memory device may include a delay locked loop (DLL) circuit, an adaptive power saving decision circuit and a control circuit. The DLL circuit may include a plurality of sub-circuits. The DLL circuit may be configured to generate a delay locked clock that synchronizes with a phase of an input clock of the DLL circuit. The adaptive power saving decision circuit may be configured to calculate an additive latency (AL) value based on predetermined parameters. The control circuit may be configured to control a set of the plurality of sub-circuits of the DLL circuit to be maintained in a turn-off state based on the calculated AL value during a period of time after the semiconductor device receives an operation command in a power saving mode.

In still another embodiment, a method of operating a semiconductor memory device including a delay locked loop (DLL) circuit having n sub-circuits, n being a natural number greater than 1, is disclosed. The method may include deactivating the n sub-circuits of the DLL circuit during a power saving mode of the semiconductor memory device, receiving an operation command during the power saving mode, and after receiving the operation command, maintaining a set of the n sub-circuits in a deactivated state during a period of time. The period of time may be determined based on a column address strobe (CAS) latency value of the semiconductor memory device.

BRIEF DESCRIPTION OF THE DRAWINGS

Exemplary embodiments will be described below in more detail with reference to the accompanying drawings. The embodiments of the disclosure may, however, be embodied in different forms and should not be constructed as limited to the embodiments set forth herein.

FIG. 4 is a determination table diagram of an additive latency value of FIG. 3 according to one embodiment.

DETAILED DESCRIPTION OF PREFERRED EMBODIMENTS

Figure 1:
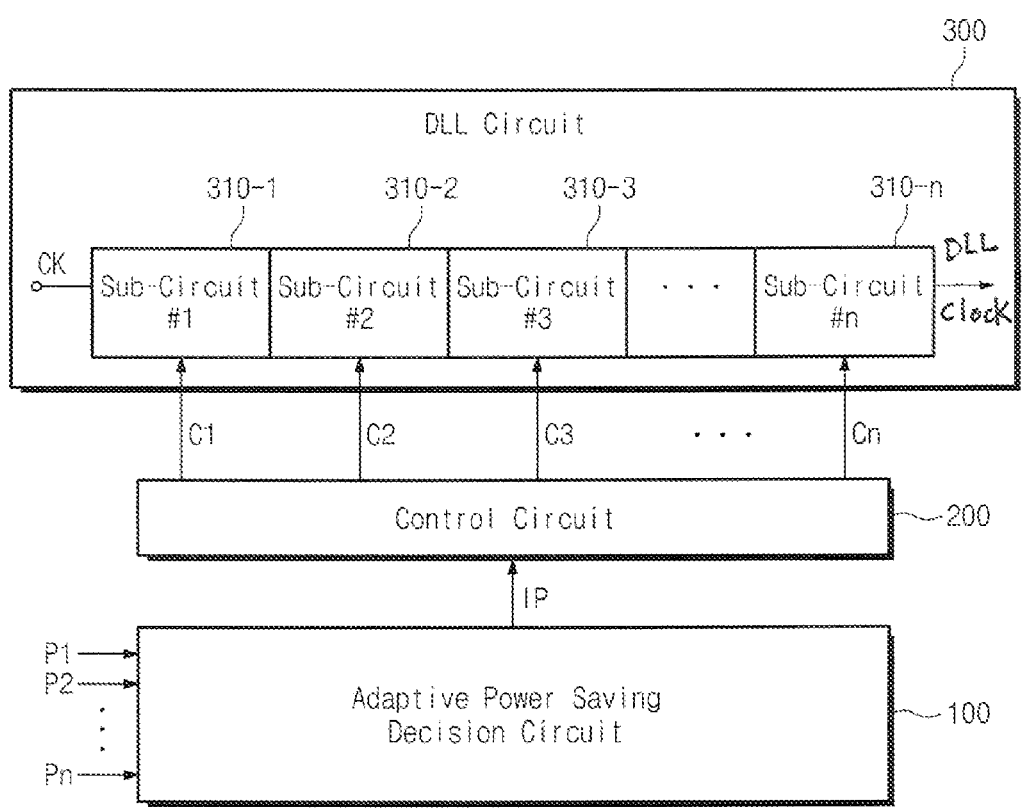
FIG. 1 is an exemplary block diagram of a semiconductor memory device according to some embodiments.

Exemplary embodiments of the present disclosure will be described more fully hereinafter with reference to the accompanying drawings, in which embodiments of the disclosure are shown. This disclosure may, however, be embodied in many different forms and should not be construed as limited to the embodiments set forth herein. In the drawings, the size and relative sizes of layers and regions may be exaggerated for clarity. Like numbers refer to like elements throughout.

It will be understood that, although the terms first, second, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present disclosure.

It will be understood that when an element or layer is referred to as being "on," "connected to" or "coupled to"

another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless expressly defined in a specific order herein, respective steps described in the present disclosure may be performed otherwise. That is, the respective steps may be performed in a specified order, substantially at the same time, or in reverse order.

Hereinafter, a semiconductor memory device including a delay locked loop circuit and a method of controlling a delay locked loop circuit according to some exemplary embodiments will be described with reference to the appended drawings.

FIG. 1 is an exemplary block diagram of a semiconductor memory device (e.g., a synchronous semiconductor memory device) according to some embodiments.

Referring to FIG. 1, a semiconductor memory device includes an adaptive power saving decision circuit 100, a control circuit 200 and a delay locked loop (DLL) circuit 300.

The delay locked loop circuit 300 includes a plurality of sub-circuits 310-1, 310-2, 310-3, . . . , 310-n which are independently drive-controlled, and generates a delay locked loop (DLL) clock which synchronizes with a phase of a clock being applied through an output stage.

The adaptive power saving decision circuit 100 calculates an additive latency (AL) value on the basis of predetermined parameters. In one embodiment, the adaptive power saving decision circuit 100 decides the number of sub-circuits capable of being maintained off among the sub-circuits 310-1, 310-2, 310-3, . . . , 310-n.

The predetermined parameters can be applied to parameter input ports P1, P2, . . . , Pn of the adaptive power saving decision circuit 100. The predetermined parameters may include, for example, a CAS latency (CL) value (e.g., CL=5, 6, 7, . . . ) and an N value (N is a natural number) obtained by dividing a period of time from a time of an input clock of the DLL circuit to a time of enabling a data strobe signal (DQS) of the semiconductor memory device by a clock period of the DLL circuit.

In one embodiment, based on the decision of a set of sub-circuits that can be maintained off, the adaptive power saving decision circuit 100 applies a determination control signal IP to the control circuit 200.

The control circuit 200 then maintains the set of sub-circuits in a turn-off state until turn-on time according to a read command arrives. For example, the turn-on time may occur a period of time after receiving a read command. The period of time may be determined, for example, based on the calculated AL value. In one embodiment, the control circuit 200 outputs block drive signals C1, C2, C3, . . . , Cn according to the determination control signal IP to control the plurality of turned-off sub-circuits of the DLL circuit to be maintained in a turn-off state.

The sub-circuits of the delay locked loop circuit 310-1, 310-2, 310-3, . . . , 310-n may be independently drive-controlled according to a logic state of the block drive signals C1, C2, C3, . . . , Cn. For example, if the block drive signal C1 has a logic state (e.g., logic low) indicating an operation off-state, the corresponding sub-circuit 310-1 maintains an off-state until a turn-on time according to a read command arrives.

Consequently, even if a read command (or, an operation command) comes during a standby operation (e.g., a power saving mode), the sub-circuit 310-1 is not immediately turned on but maintains a turn-off state for a specific period of time. Accordingly, additional power saving may be achieved.

If the block drive signal C2 has a logic state (e.g., logic low) indicating an operation off-state, the corresponding sub-circuit 310-2 maintains an off-state until a turn-on time according to the read command arrives.

If the block drive signal C3 has a logic state (e.g., logic low) indicating an operation off-state, the corresponding sub-circuit 310-3 among the delay locked loop circuit blocks maintains an off-state until a turn-on time according to the read command arrives.

The specific period of time maintained in a turn-off state may be controlled based on the additive latency (AL) value.

The greater the N value is, the smaller the additive latency value is and the greater the CAS latency value is, the greater the additive latency value is. The additive latency value (L) is in proportion to the CAS latency value and is in inverse proportion to the N value.

As the additive latency value (L) becomes higher, the number of sub-circuits to be maintained in a turn-off state may increase and thereby an effect of power saving increases.

An arrival of the turn-on time according to the read command may be determined by the read latency value (e.g., a CAS latency value). As the read latency value becomes higher, an arrival time of turn-on time according the read command is longer.

Figure 2:
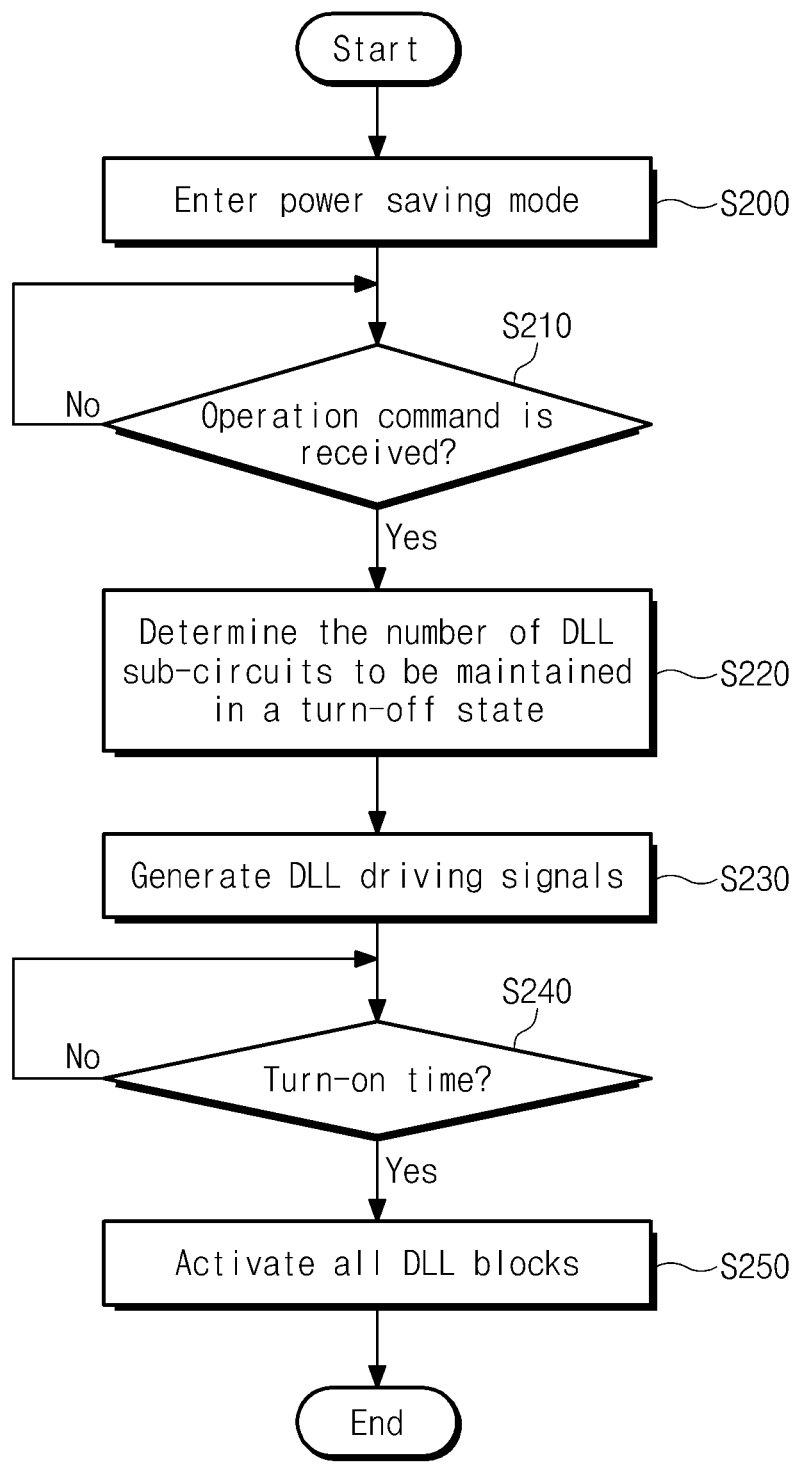
FIG. 2 is an exemplary flow chart of a control of a delay locked loop circuit of FIG. 1 according to one embodiment.

FIG. 2 is an exemplary flow chart of a control of a delay locked loop circuit of FIG. 1 according to one embodiment.

Control flow steps S200~S250 illustrated in the flow chart of FIG. 2 can be performed by the semiconductor memory device of FIG. 1.

In a step S200, in the case that a current operation mode is set to a power saving mode (e.g., a standby operation), the semiconductor memory device enters the power saving mode. The power saving mode can be set, for example, using an external command or a mode register set signal of the semiconductor memory device.

In a step S210, the semiconductor memory device checks whether an operation command (e.g., an active command or a read command) is received in a power saving mode (e.g., a standby operation). As a check result, the operation command is received but the plurality of sub-circuits of the delay locked loop circuit are not activated at this time. To realize power saving, an activation time of the sub-circuits of the delay locked loop circuit may be maximally delayed in consideration of an additive latency value.

In a step S220, the adaptive power saving decision circuit 100 of the semiconductor memory device calculates an additive latency value on the basis of predetermined parameters and determines the number of sub-circuits to be maintained in a turn-off state according to the calculated additive latency value.

In a step S230, the control circuit 200 of the semiconductor memory device outputs the block drive signals C1, C2, C3, ..., Cn as drive signals according to the determination control signal IP to control sub-circuits to be maintained in a turn-off state.

Accordingly, the sub-circuits are maintained in a turn-off state until a turn-on time according to a read command arrives.

The sub-circuits may include, for example, at least one of a clock buffer, a control buffer, a delay chain block, a phase interpolator and a duty correction circuit.

In a step S240, the control circuit 200 of the semiconductor memory device checks whether a turn-on time arrives. The turn-on time may occur a period of time after the semiconductor memory device receives a read command.

In the case that a turn-on time arrives, in a step S250, the control circuit 200 of the semiconductor memory device drives each of the sub-circuits of the delay locked loop circuit in the turn-off state to a turn-on state.

Figure 3:
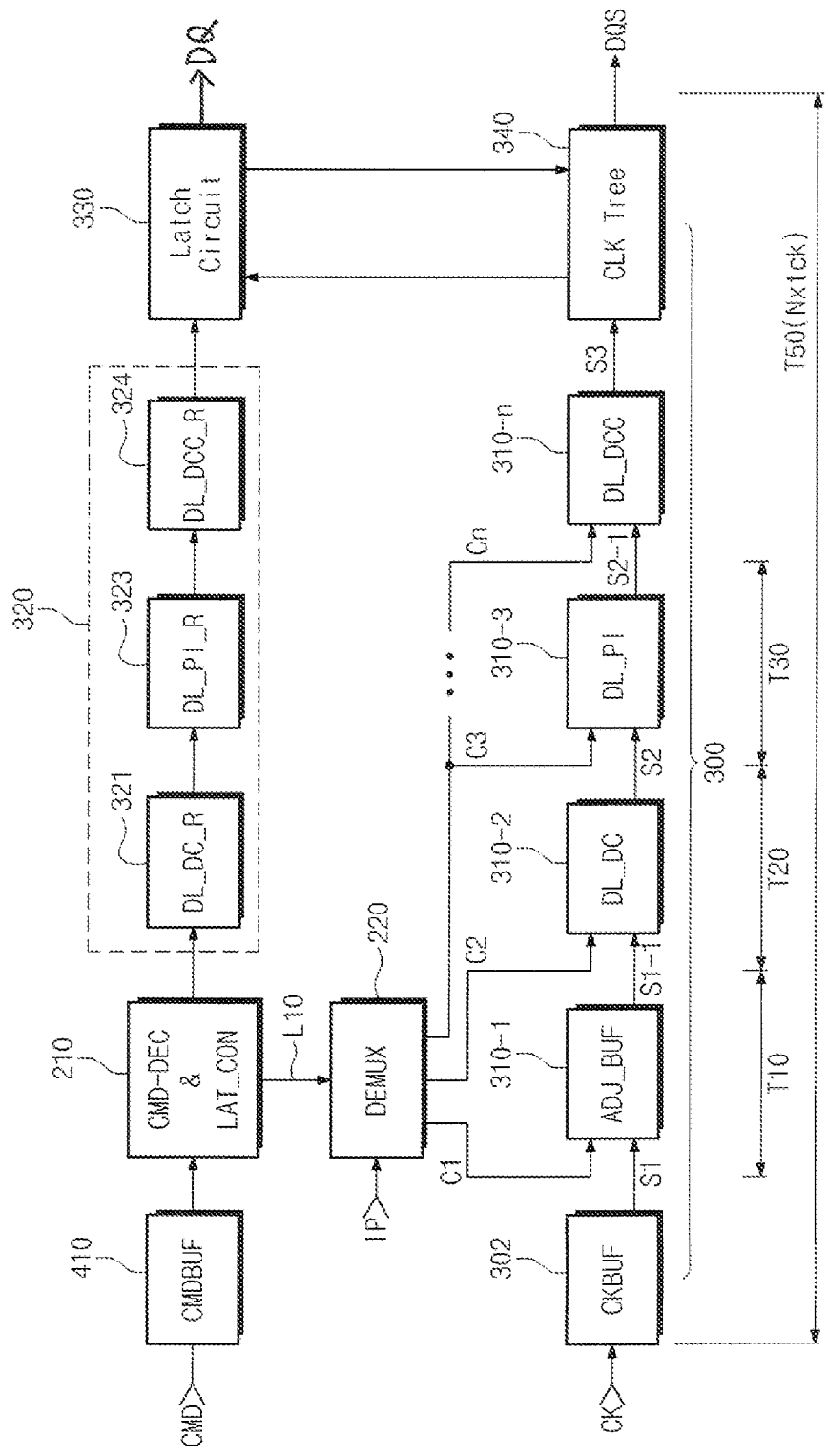
FIG. 3 is a detailed illustrative view of FIG. 1 according to one embodiment.

FIG. 3 is a detailed illustrative view of FIG. 1 according to one embodiment.

Referring to FIG. 3, a DLL circuit may include a clock buffer (CKBUF) 302, a control buffer (ADJ_BUF) 310-1, a delay chain (DL_DC) 310-2, a phase interpolator (DL_PI) 310-3, a duty correction circuit (DL_DCC) 310-n and a clock tree (CLK Tree) 340.

In FIG. 3, a command buffer (CMDBUF) 410, a command decoder & latency control circuit (CMD_DEC & LAT_CON) 210, a replica circuit 320 and a latch circuit 330 can constitute a circuit related to a latency of an SDRAM. The replica circuit 320 constituted to offset a delay value caused by a constitution of a DLL may include a delay chain replica (DL_DC_R) 321, a phase interpolator replica (DL_PI_R) 323 and a duty correction circuit replica (DL_DCC_R) 324.

A demultiplexer (DEMUX) 220 may be included in the control circuit 200 of FIG. 1.

The command decoder & latency control circuit 210 may be included in the adaptive power saving decision circuit 100 of FIG. 1.

The latch circuit 330 synchronizes with a clock CK being applied and may include an output driver for outputting data DQ according to a read latency value being applied.

The clock tree 340 may include an output driver for outputting a data strobe signal DQS in synchronization with a clock CK being applied.

The command decoder & latency control circuit 210 decodes a command CMD being applied and controls a read latency like a CAS latency on the basis of an internal output clock of the DLL circuit.

The demultiplexer 220 performs a demultiplexing operation to control delay locked loop circuit blocks capable of being turned off to be maintained in a turn-off state. The demultiplexer 220 can be connected to the command decoder & latency control unit 210 through a line L10 to receive a drive control signal. The demultiplexer 220 outputs block drive signals C1, C2, C3, ..., Cn on the basis of the determination control signal IP. In the case that a drive control signal being applied through the line L10 has a specific logic state, for instance, a logic high state, the block drive signals C1, C2, C3, ..., Cn can be changed into a turn-on drive state.

In one embodiment, the clock buffer 302 may output a clock signal S1 based on the clock CK, the control buffer 310-1 may receive the clock signal S1 and output a clock signal S1-1 in response to the block drive signal C1, the delay chain 310-2 may receive the clock signal S1-1 and output a clock signal S2 in response to the block drive signal C2, the phase interpolator 310-3 may receive the clock signal S2 and output a clock signal S2-1 in response to the block drive signal C3, and the duty correction circuit 310-n may receive the clock signal S2-1 and output a clock signal S3 in response to the block drive signal Cn. Additionally, the clock buffer 302 and the clock tree 340 may be controlled by other block drive signals, respectively.

For example, if the drive control signal having a logic high state is provided while the control buffer 310-1 and the delay chain 310-2 maintain a turn-off state by the block drive signals C1 and C2, the control buffer 310-1 and the delay chain 310-2 are immediately turned on to perform a control buffering operation and a clock delay operation respectively.

In one embodiment, the circuit of FIG. 3 may be applied to DDR4. 3.2 GT/s operation. An operation range of SDRAM required by a DDR4 newly introduced after a DDR3 is from 1.6 GT/s to 3.2 GT/s and an operation voltage of the DDR4 is 1.2V.

Generally, in a standby state, for instance, 3N state of SDRAM, a DLL always drives the delay chain 310-2 to a turn-on state due to an on-time issue. The on-time issue means that when data and a clock meet at a margin point like an input stage of the latch circuit 330, the clock always arrives before the data to be toggled.

In the case that a power supply voltage VDD of the semiconductor memory device increases or an additive latency (AL) exists, or in the case that CAS latency (CL) is high, a margin for reading data increases. Thus, in that case, a number of sub-circuits of the DLL circuit which are turned on for power saving may be reduced.

Determination of the additive latency value may be changed depending on variable parameters.

FIG. 4 is a determination table diagram of an additive latency value of FIG. 3 according to one embodiment.

Referring to FIG. 4, in the table, a horizontal direction indicates a CL value and a vertical direction indicates an N value. A CAS latency (CL) value (e.g., CL=5, 6, 7, ...) corresponding to a predetermined parameter is given when a command is input. For example, the CAS latency (CL) value may be a value provided from a memory controller.

The N (N is a natural number) corresponding to another predetermined parameter is a value obtained by dividing a period of time from a time of an input clock of the DLL circuit to a time of enabling a data strobe signal (DQS) by a clock period of the delay locked loop circuit. A period T50 (Nxtck) illustrated in FIG. 3 represents a value obtained by multiplying the N value by the clock period. If it is assumed that a delay of until the DQS is output after a DLL is locked is called a DQS_DELAY and the clock period is tck, the N=DQS_DELAY/tck. The DLL locking means that an internal clock is synchronized with an external clock being applied from the outside by a DLL operation and in this case, a phase of the internal clock equals to a phase of the external clock.

The N value represents how many multiples the quantity of delay between an input clock of the DLL circuit and a DQS corresponds to the clock period when a DLL is locked.

In the table of FIG. 4, in the case that the N value is 1 and the CL value is 10, the additive latency value is determined to be 7. In the case that the N value is 2 and the CL value is 10, the additive latency value is determined to be 6. In the case that the N value is 6 and the CL value is 10, the additive latency value is determined to be 2. Consequently, in condition that the CL value is the same, the smaller the N value is, the greater the additive latency value is.

In the table of FIG. 4, in the case that the N value is 3 and the CL value is 6, the additive latency value is determined to be 1. In the case that the N value is 3 and the CL value is 7, the additive latency value is determined to be 2. In the case that the N value is 3 and the CL value is 10, the additive latency value is determined to be 5. Consequently in condition that the N value is the same, the greater the CL value is, the greater the additive latency value is.

In the table of FIG. 4, as the VDD increases (e.g., 1.1V to 1.35V), the additive latency value becomes great.

For convenience, the additive latency value is expressed by a character L.

If the additive latency value (L) is determined by the parameters in FIG. 4, the number of sub-circuits to be maintained in a turn-off state may be adaptively determined.

In one embodiment, the additive latency value (L) is comparatively small, and only the duty correction circuit 310-n of the delay locked loop circuit is maintained in a turn-off state during a period of time after the semiconductor device receives an operation command (e.g., an active command or a read command) in a power saving mode. In another embodiment, the additive latency value (L) is comparatively small, and only the clock tree 340 of the delay locked loop circuit is maintained in a turn-off state during a period of time after the semiconductor device receives an operation command in a power saving mode.

In the case that the additive latency value (L) is comparatively high, the duty correction circuit 310-n, the phase interpolator 310-3, the delay chain 310-2 and the control buffer 310-1 of the delay locked loop circuit 300 may be maintained in a turn-off state during a period of time after the semiconductor device receives an operation command in a power saving mode.

At least a portion of the sub-circuits corresponding to a first section T10, a second section T20 and a third section T30 of FIG. 3 can be controlled to be turned off depending on the additive latency value (L).

Thus, as the additive latency value (L) becomes high, the number of sub-circuits to be maintained in a turn-off state increases and thereby power consumption is reduced.

Figure 5:
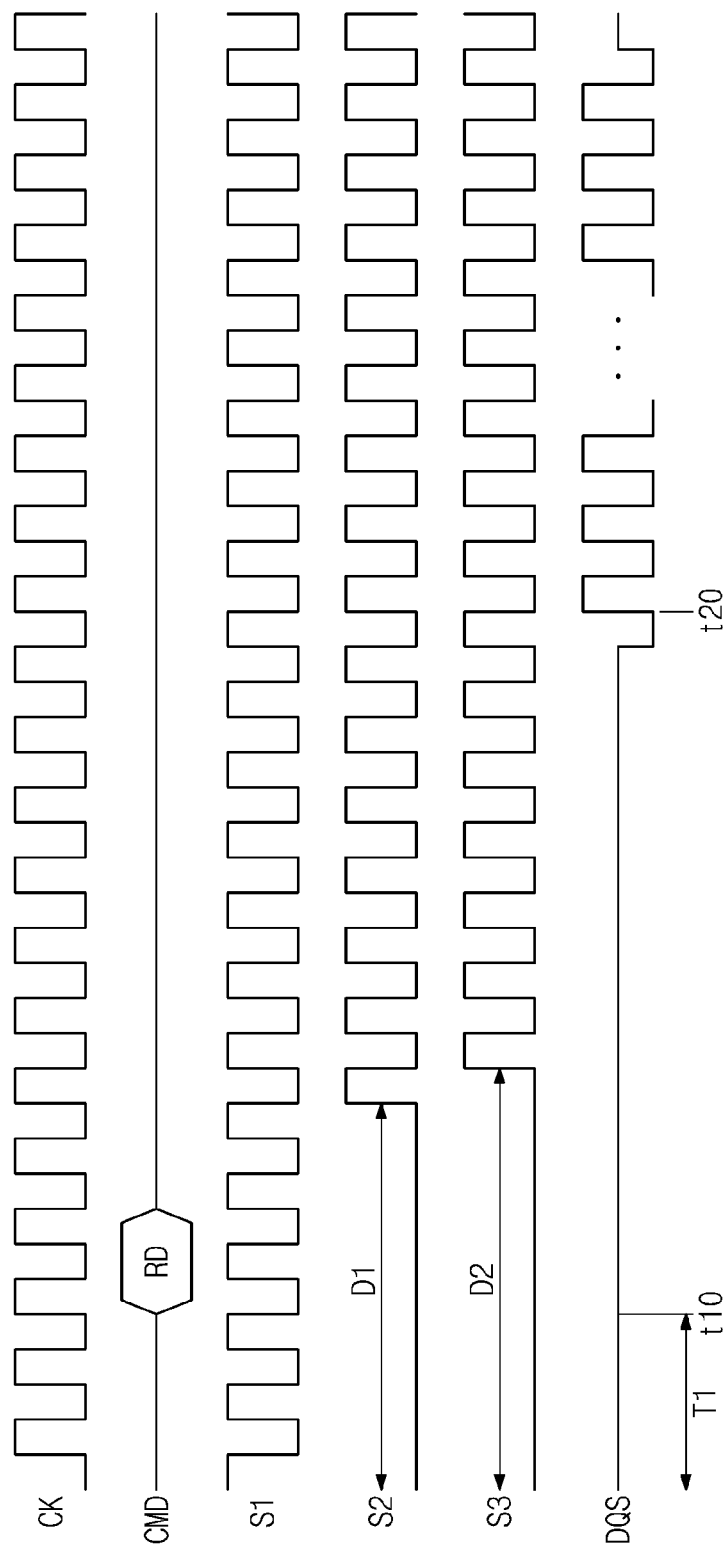
FIG. 5 is an operation timing diagram illustrating power saving of FIG. 3 according to one embodiment.

FIG. 5 is an operation timing diagram illustrating power saving of FIG. 3 according to one embodiment.

Referring to FIG. 5, an external clock CK, a command CMD (e.g., a read command RD), a waveform S1, a waveform S2, a waveform S3 and a waveform DQS are sequentially illustrated.

The waveform S1 indicates a waveform appearing at an output terminal of the clock buffer 302 of FIG. 3. The waveform S2 indicates a waveform appearing at an output terminal of the delay chain 310-2 of FIG. 3. The waveform S3 indicates a waveform appearing at an output terminal of the duty correction circuit 310-n of FIG. 3.

In FIG. 5, according to the determined additive latency value (L), the delay chain 310-2 of FIG. 3 maintains a turn-off state during a period D1. Thus, power consumption is reduced by maintaining a turn-off state during the period D1. In case of a conventional technology not applying the technology of the disclosure, the delay chain 310-2 becomes a turn-on state during a period T1 before the time point t10 without maintaining a turn-off state during the period D1.

In FIG. 5, the phase interpolator 310-3 and the duty correction circuit 310-n of latter part including the delay chain 310-2 maintains in a turn-off state during the period D1.

Consequently, even if a read command enters at the time point t10 during a standby operation, the sub-circuits of the delay locked loop circuit 310-2, 310-3 and 310-n are not immediately turned on but maintain a turn-off state during the period D1. Thus, power saving is accomplished. A turn-on time according to the read command may arrive after the period D1.

Figure 6:
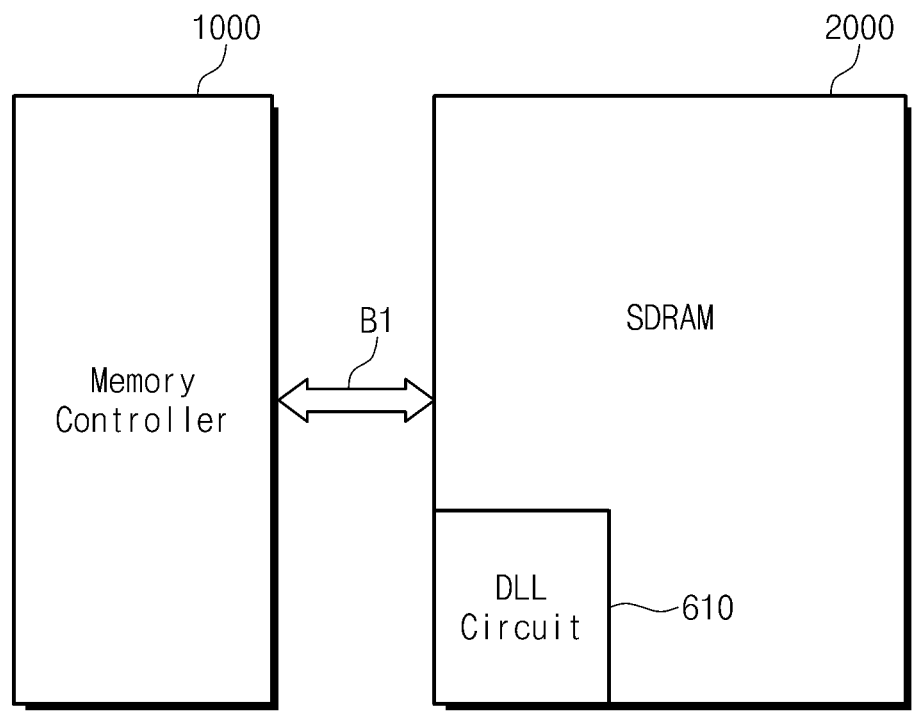
FIG. 6 is a block diagram of a memory system including the semiconductor memory device of FIG. 1 according to certain embodiments.

FIG. 6 is a block diagram of a memory system including the semiconductor memory device of FIG. 1 according to certain embodiments.

Referring to FIG. 6, a memory system may include a memory controller 1000 and a synchronous semiconductor memory device SDRAM 2000. The memory controller 1000 may communicate with the SDRAM 2000 by a bus B1.

The memory system may be connected to a CPU or a microprocessor through the memory controller 1000.

In the SDRAM 2000, a DLL circuit 610 may include the DLL circuit such as illustrated in FIG. 1. Since the number of sub-circuits of the DLL circuit to be maintained in a turn-off state may be adaptively controlled according to the determined additive latency value, an effect of power saving is determined according to the number of the sub-circuits being turned off. Thus, the memory system can reduce power consumption by including the synchronous semiconductor memory device 2000.

Figure 7:
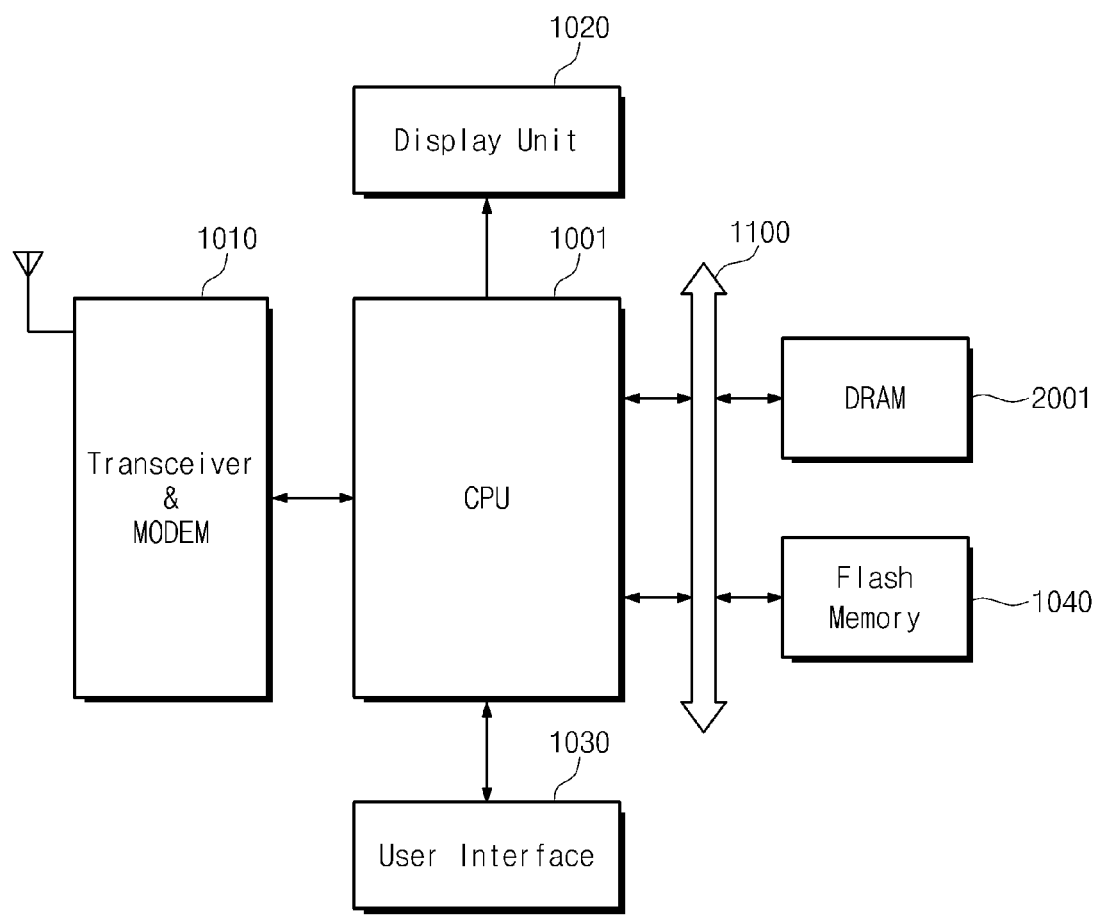
FIG. 7 is a block diagram illustrating an example of an application applied to a mobile device according to certain embodiments.

FIG. 7 is a block diagram illustrating an example of an application applied to a mobile device according to certain embodiments.

Referring to FIG. 7, a mobile device may include a transceiver & modem 1010, a CPU 1001, a DRAM 2001, a flash memory 1040, a display unit 1020 and a user interface 1030.

The CPU 1001, the DRAM 2001 and the flash memory 1040 can be manufactured or packaged in a single chip in some cases. The DRAM 2001 and the flash memory 1040 can be embedded in the mobile device.

In the case that the mobile device is a portable communication device, the transceiver & modem 1010 performs functions of transmit/receive of communication data and modulation/demodulation of data.

The CPU 1001 controls the whole operation of the mobile device according to the program previously set. The CPU 1001 may include a monitor 230 in accordance with the disclosure.

The DRAM 2001 is connected to the CPU 1001 through a system bus 1100 and can function as a buffer or main memory of the CPU 1001. The DRAM 2001 may include a block diagram such as illustrated in FIGS. 1 and 3. Since the number of sub-circuits of the DLL circuit to be maintained in a turn-off state may be adaptively controlled according to the determined additive latency value, a power saving effect is determined depending on the number of the sub-circuits of the DLL circuit being turned off. Thus, the mobile device may reduce power consumption by including the DRAM 2001.

The CPU 1001 can apply a command, an address and write data to the DRAM 2001 through the system bus 1100.

The flash memory 1040 may be a NOR or NAND type flash memory.

The display unit 1020 may have a touch screen as a device such as a liquid crystal having a backlight, a liquid crystal having a LED light source or an OLED. The display unit 1020 functions as an output device representing an image such as a character, a number or a picture by color.

The user interface 1030 may be one of various interface protocols such as a universal serial bus (USB), a peripheral component interconnect-express (PCIE), a serial attached SCSI (SAS), a serial advanced technology attachment (SATA), a parallel ATA (PATA), a small computer system interface (SCSI), an enhanced small disk interface (ESDI) and an integrated drive electronics (IDE).

The mobile device is mainly described as a mobile communication device but it can function as a smart card by adding or subtracting constituent elements if necessary.

The mobile device can connect a separate interface to an external communication device. The communication device may be a DVD (digital versatile disc) player, a computer, a set top box (STB), a game machine, a digital camcorder, etc.

Although not illustrated in the drawing, the mobile device may further include an application chipset, a camera image processor (CIS), a mobile DRAM, etc.

The DRAM 2001 chip and the CPU 1001 chip can be mounted using various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

Although a flash memory is adopted as an illustration in FIG. 7, various types of nonvolatile storages may be used.

The nonvolatile storage may store data information having various forms of data such as a text, a graphic, a software code, etc.

The nonvolatile storage may be embodied by, for example, an electrically erasable programmable read-only memory (EEPROM), a flash memory, a magnetic random access memory (MRAM), a spin-transfer torque MRAM, a conductive bridging RAM (CBRAM), a ferroelectric RAM (Fe-RAM), a phase change RAM (PRAM) which is called an ovonic unified memory (OUM), a resistive RAM (RRAM), a nanotube RRAM, a polymer RAM (PoRAM), a nanotube floating gate memory (NFGM), a holographic memory, a molecular electronics memory device, or an insulator resistance change memory.

Figure 8:
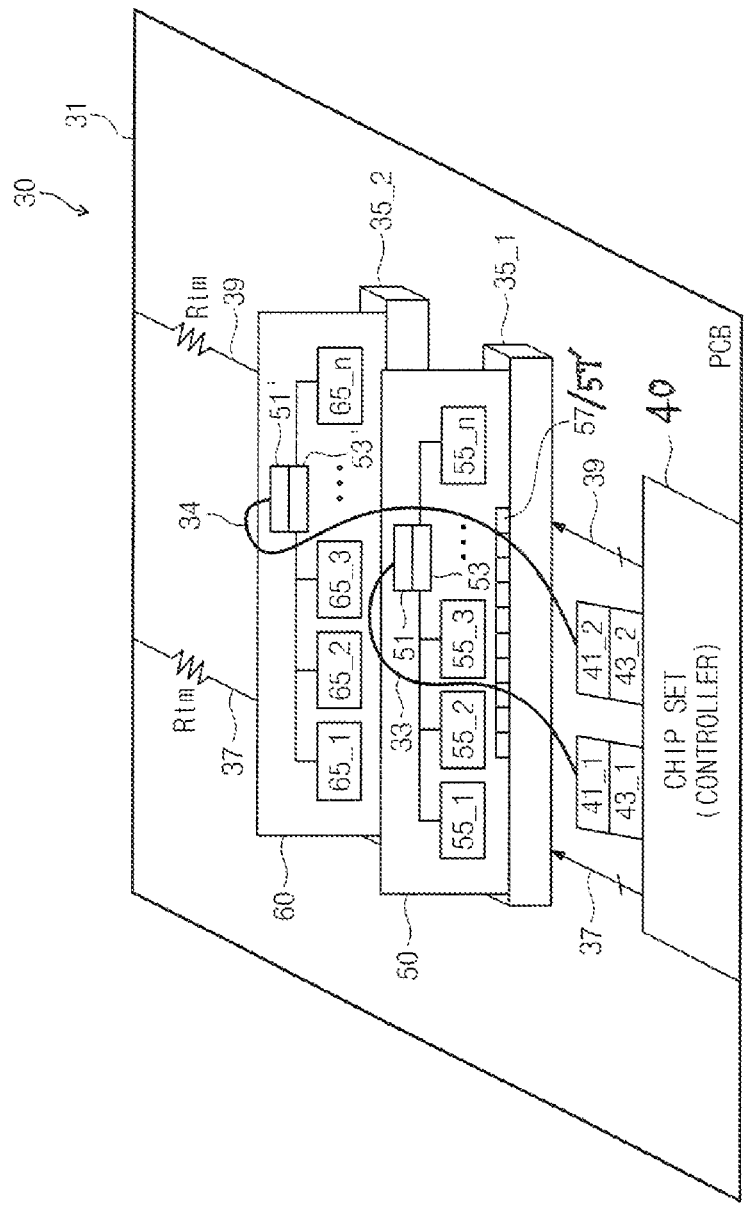
FIG. 8 is a block diagram illustrating an example of an application applied to an optical I/O schema.

FIG. 8 is a block diagram illustrating an example of an application applied to an optical I/O schema. Referring to FIG. 8, a memory system 30 adopting a high speed optical I/O includes a chipset (e.g., a controller) 40 and memory modules 50 and 60 that are mounted on a PCB 31. The memory modules 50 and 60 are inserted into slots 35_1 and 35_2 respectively installed on the PCB 31. The memory module 50 includes a connector 57, DRAM memory chips 55_1~55_n, an optical I/O input unit 51 and an optical I/O output unit 53. The memory module 60 includes a connector 57', DRAM memory chips 65_1~65_n, an optical I/O input unit 51' and an optical I/O output unit 53'.

Each of the optical I/O input units 51 and 51' may include a photoelectric converter, for example, a photodiode for converting an optical signal into an electrical signal. An electrical signal output from the photoelectric converter is received to each of the memory modules 50 and 60. Each of the optical I/O output units 53 and 53' may include an electrophotic converter, for example, a laser diode for converting an electrical signal output from each of the memory modules 50 and 60 into an optical signal. If necessary, each of the optical I/O output units 53 and 53' may further include an optical modulator for modulating a signal output from a light source.

An optical cable 33 is in charge of an optical communication between the optical I/O input unit 51 of the memory module 50 and an optical transmission unit 41_1 of the chipset 40. Also, the optical cable 33 is in charge of an optical communication between the optical I/O output unit 53 of the memory module 50 and an optical transmission unit 43_1 of the chipset 40. An optical cable 34 is in charge of an optical communication between the optical I/O input unit 51' of the memory module 60 and an optical transmission unit 41_2 of the chipset 40. Also, the optical cable 34 is in charge of an optical communication between the optical I/O output unit 53' of the memory module 60 and an optical transmission unit 43_2 of the chipset 40. The optical communication may have a bandwidth of several tens of gigabits per second. The memory module 50 can receive signals or data being applied from signal lines 37 and 39 of the chipset 40 through the connector 57 and can perform a high speed data communication with the chipset 40 through the optical cable 33. Resistors Rtm installed on the lines 37 and 39 not described are termination resistors.

In even the case of the memory system 30 adopting the optical I/O structure such as illustrated in FIG. 8, a DLL circuit being adaptively turned off according to an additive latency value can be mounted. Thus, the number of sub-circuits of the DLL circuit to be maintained in a turn-off state may be adaptively controlled according to the determined additive latency value. Accordingly, the memory system 30 adopting the high speed optical I/O may reduce power consumption.

Figure 9:
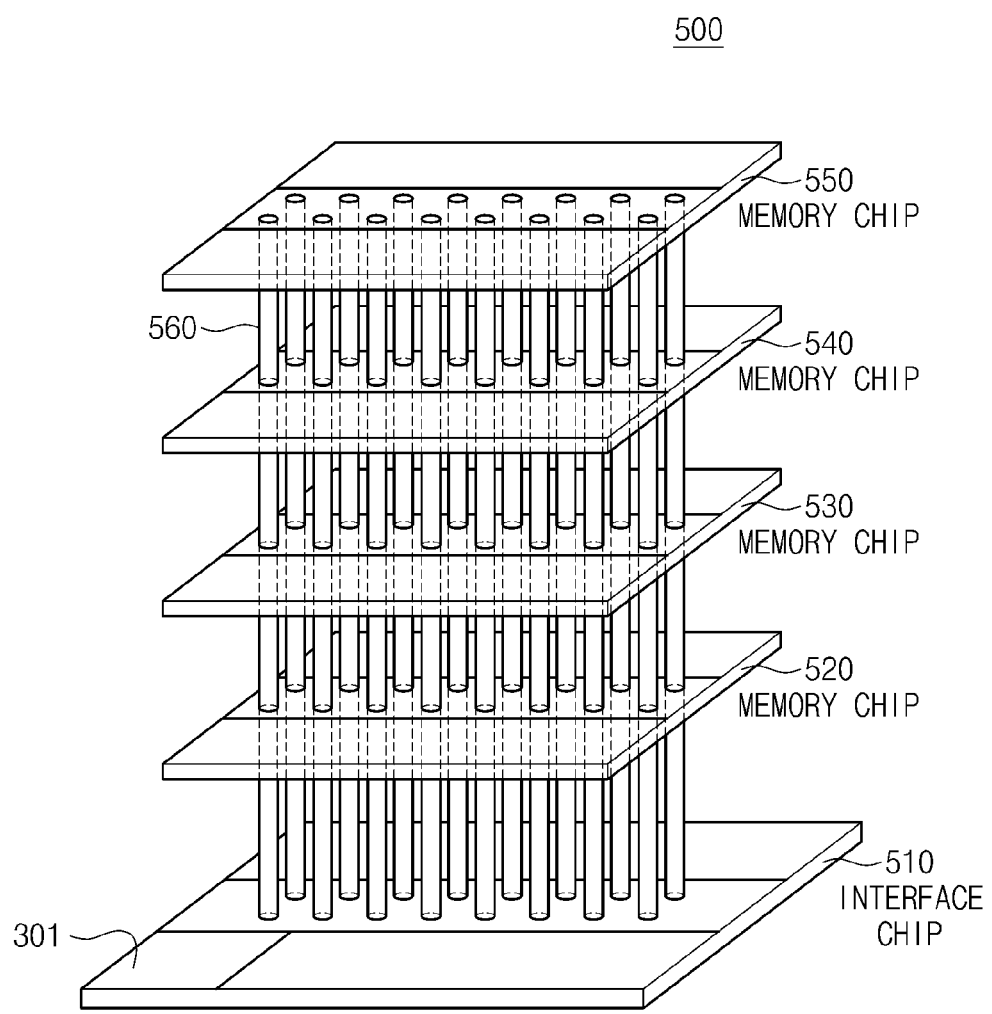
FIG. 9 is a block diagram illustrating an example of an application applying through silicon via (TSV).

FIG. 9 is a block diagram illustrating an example of an application applying through substrate vias (e.g., through silicon vias, TSVs).

Referring to a structure of a stacked memory device 500, a plurality of memory chips 520, 530, 540 and 550 are vertically stacked on a top surface of an interface chip 510. A plurality of through silicon vias 560 is formed while passing through the memory chips 520, 530, 540 and 550. A three-dimensional stack package type memory device 500 vertically stacking memory chips on the top surface of the interface chip 510 using a TSV technology has a structure which is advantageous to high speed, low power consumption and miniaturization while storing large amounts of data. A functional block 301 formed in the interface chip 510 can correspond to a controller.

In even the case of the stacked memory device illustrated in FIG. 9, a DLL circuit being adaptively turned off according to an additive latency value may be mounted on DRAMS in the memory chips 520, 530, 540 and 550. Thus, since the number of sub-circuits of the DLL circuit to be maintained in a turn-off state may be adaptively controlled according to the determined additive latency value, the stacked memory device may reduce power consumption during a standby operation. In the case of FIG. 9, an advantage of multichip package is provided and competitiveness of memory products can also be improved.

A memory cell array of the each DRAM includes a plurality of memory cells arranged in a matrix form of row and column. Each memory cell includes one access transistor and one storage capacitor. A gate of the access transistor is connected to a corresponding word line. A drain of the access transistor is connected to a corresponding bit line. A plurality of memory cells connected to the same word line forms a memory page.

A DRAM loses its stored data when its power supply is interrupted. Because of a leakage current flowing during a memory operation, the DRAM needs a refresh operation that after reading data stored in a memory cell, the read data is restored in the corresponding memory cell.

A refresh operation of DRAM is similar to a data read operation but the refresh operation differs from the data read operation in that the refresh operation does not output data to an external device.

Generally, a refresh operation of DRAM begins by changing a row address strobe (RASB) signal from logic 'high' to logic 'low' to apply the changed RASB signal to the DRAM. A DRAM accomplishes a refresh operation by activating a word line corresponding to a row address to be refreshed and then driving a bit line sense amplifier sensing data of a memory cell.

A usual refresh standard of a DRAM is 16 ms/1024 cycle at 4 mega. It is advised to maintain a refresh interval of 15.6 us. A memory controller applies a refresh command to a DRAM over a period of 15.6 us. A refresh time can be determined by the total number of rows and the number of refresh cycles of a DRAM. For instance, in the case of a refresh cycle of 4096, a refresh time becomes 64 ms by multiplying 15.6 us by 3096.

Although a few embodiments of the present disclosure have been shown and described, it will be appreciated by those skilled in the art that changes may be made in these embodiments without departing from the principles and spirit of the general inventive concept, the scope of which is defined in the appended claims and their equivalents. Therefore, the above-disclosed embodiments are to be considered illustrative, and not restrictive.

What is claimed is:

1. An operating method of a delay locked loop (DLL) circuit for a semiconductor memory device, the DLL circuit including a plurality of sub-circuits, the method comprising:
   calculating an additive latency value based on predetermined parameters; and
   controlling a set of the plurality of sub-circuits of the DLL circuit to be maintained in a turn-off state based on the calculated additive latency value, during a period of time after the semiconductor memory device receives an operation command in a power saving mode.

2. The method of claim 1, wherein the predetermined parameters comprise a column address strobe (CAS) latency value.

3. The method of claim 1, wherein the predetermined parameters comprise an N value, N being a natural number and obtained by dividing a period of time from a time of an input clock of the DLL circuit to a time of enabling a data strobe signal (DQS) of the semiconductor device by a clock period of the DLL circuit.

4. The method of claim 1, wherein the predetermined parameters comprise a CAS latency value and an N value, N being a natural number and obtained by dividing a period of time from a time of an input clock of the DLL circuit to a time of enabling a data strobe signal (DQS) of the semiconductor memory device by a clock period of the DLL circuit.

5. The method of claim 1, wherein the period of time is determined based on a column address strobe (CAS) latency value.

6. The method of claim 5, wherein the period of time increases by increasing a power supply voltage of the semiconductor memory device or the CAS latency value.

7. The method of claim 5, wherein the period of time is further determined based on an N value, N being a natural number and determined by dividing a period of time from a time of an input clock of the DLL circuit to a time of enabling a data strobe signal (DQS) of the semiconductor memory device by a clock period of the DLL circuit.

8. The method of claim 7, wherein the period of time increases by decreasing the N value.

9. The method of claim 1, further comprising activating each of the plurality of sub-circuits after the period of time.

10. The method of claim 1, wherein the plurality of sub-circuits of the DLL circuit comprise at least one of a clock buffer, a control buffer, a delay chain block, a phase interpolator and a duty correction circuit.

11. A semiconductor memory device comprising:
    a delay locked loop (DLL) circuit including a plurality of sub-circuits, the DLL circuit configured to generate a delay locked clock that synchronizes with a phase of an input clock of the DLL circuit;
    an adaptive power saving decision circuit configured to calculate an additive latency (AL) value based on predetermined parameters; and
    a control circuit configured to control a set of the plurality of sub-circuits of the DLL circuit to be maintained in a turn-off state during a period of time after the semiconductor device receives an operation command in a power saving mode based on the calculated AL value.

12. The semiconductor memory device of claim 11, wherein the plurality of sub-circuits comprise at least one of a clock buffer, a control buffer, a delay chain, a phase interpolator and a duty correction circuit.

13. The semiconductor memory device of claim 11, wherein each of the plurality of sub-circuits is activated after the period of time.

14. The semiconductor memory device of claim 11, wherein the each of the predetermined parameters comprise a CAS latency value and an N value, N being a natural number and obtained by dividing a period of time from a time of an input clock of the DLL circuit to a time of enabling a data strobe signal (DQS) of the semiconductor memory device by a clock period of the DLL circuit.

15. The semiconductor memory device of claim 14, wherein the period of time increases by increasing a power supply voltage of the semiconductor memory device or the CAS latency value, and
    wherein the period of time decreases by increasing the N value.

16. A method of operating a semiconductor memory device including a delay locked loop (DLL) circuit having n sub-circuits, n being a natural number greater than 1, the method comprising:
    deactivating the n sub-circuits of the DLL circuit during a power saving mode of the semiconductor memory device;
    receiving an operation command during the power saving mode; and
    after receiving the operation command, maintaining a set of the n sub-circuits in a deactivated state during a period of time,
    wherein the period of time is determined based on a column address strobe (CAS) latency value of the semiconductor memory device.

17. The method of claim 16, further comprising activating each of the n sub-circuits of the DLL circuit after the period of time.

18. The method of claim 16, wherein the maintaining a set of the n sub-circuits in a deactivated state is responsive to m control signals, m being a natural number equal to or less than n, and
    wherein each of the m control signals is activated with delay by increasing a power supply voltage or the CAS latency value.

19. The method of claim 16, wherein the period of time is further determined based on an N value, N being a natural number and determined by dividing a period of time from a time of an input clock of the DLL circuit to a time of enabling a data strobe signal (DQS) of the semiconductor memory device by a clock period of the DLL circuit.

20. The method of claim 19, wherein the period of time increases by decreasing the N value.

\* \* \* \* \*